United States Patent
Sriram (10) Patent No.: US 7,372,378 B2
(45) Date of Patent: May 13, 2008

(54) EFFICIENT DECODING OF N-TUPLE VARIABLE BIT LENGTH SYMBOLS

(75) Inventor: Partha Sriram, Los Altos, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 11/293,708

(22) Filed: Dec. 1, 2005

(65) Prior Publication Data

US 2007/0126608 A1    Jun. 7, 2007

(51) Int. Cl.
    *H03M 7/40*    (2006.01)
(52) U.S. Cl. .................................... 341/67; 341/51
(58) Field of Classification Search ............... 341/67, 341/65, 51; 375/253; 701/200, 208; 707/100
    See application file for complete search history.

(56) References Cited

U.S. PATENT DOCUMENTS

| | | | |
|---|---|---|---|
| 6,008,745 A * | 12/1999 | Zandi et al. ................ | 341/67 |
| 6,041,403 A * | 3/2000 | Parker et al. ............... | 712/210 |
| 6,543,023 B2 * | 4/2003 | Bessios ....................... | 714/758 |
| 6,839,624 B1 * | 1/2005 | Beesley et al. ............. | 701/200 |
| 2004/0081245 A1 * | 4/2004 | Deeley et al. .............. | 375/253 |

\* cited by examiner

*Primary Examiner*—Jean Bruner Jeanglaude
*Assistant Examiner*—Joseph Lauture (57) ABSTRACT

Methods and systems that leverage the advantages of Huffman coding to increase processing efficiency of a datastream while simultaneously minimizing storage requirements are provided. Decoding efficiency and table storage requirements can be balanced to produce systems that can be adapted for use in high-end network infrastructure applications and for low-resourced portable consumer devices. The systems and methods are operative in decoding data streams using multi-symbol codes and sign information, including AAC and MP3 data streams. A hierarchical structure of tables is described as having primary tables, secondary tables, tertiary tables and so on. Optimization balances processing requirements, table storage requirements and the described systems and methods may be implemented on a variety of processing platforms.

19 Claims, 9 Drawing Sheets

Figure 10

EFFICIENT DECODING OF N-TUPLE VARIABLE BIT LENGTH SYMBOLS

BACKGROUND OF THE INVENTION

1. Field of the Invention

The present Application relates to data encoding systems and methods. More particularly, the present Application relates to variable length encoding systems.

2. Description of Related Art

The well-known Advanced Audio Coding ("AAC") method is used in various applications implementing audio codecs, including wireless, CATV, digital broadcast and Internet arenas. AAC generally provides high efficiency audio encoding. AAC decoder technology relies on Huffman decoding of variable length symbols. AAC schemes often use 11 Huffman tables as specified by the MPEG-2 and MPEG-4 audio standards. As commonly implemented, Huffman decoding resolves two bits at a time and, as a result, suffers from high computational complexity. Resolving more than 2 bits at a time is not contemplated because of the associated exponential increase in Huffman tables and consequent increased memory requirements.

Processing efficiency in systems implementing Huffman coding is generally achieved by increasing Huffman table sizes. Efficiency increases because increased table sizes permits a larger number of bits to be decoded for each lookup. Therefore, the index to a Huffman table should have a bit field of length equal to the maximum size of a field to be decoded. Thus, for example, a field of maximum length equal to 5 bits would be most efficiently decoded using a Huffman table having a size of $S_{table}=2^5=32$ elements. In another example, a field size of 16 bits requires a Huffman table size, $S_{table}=2^{16}=65,536$. It can be appreciated, however, that efficiency is limited by the amount of storage available to maintain large Huffman tables. In many systems, tradeoff between efficiency and table size is manifested as a compromise between performance and cost of storage.

Large Huffman tables are often desirable in schemes that encode multiple symbols per codeword. In MP3 and AAC Audio coding specification, each variable length bit field can represent values for 1, 2 or 4 consecutive samples. For convenience, such groups of symbols will be referred to as 2-tuple, 4-tuple and n-tuple, where "n" signifies the number of symbols encoded. A MP3 or AAC audio encoder may choose to adaptively use a Huffman Table that is appropriate for 2-tuple or 4-tuple fields. The choice of which table is chosen is sent as a side information that is embedded in the MP3/AAC bit-stream.

Finally, the individual sample values in a 2-tuple or a 4-tuple may be signed values. When signed values are to be encoded, the magnitude of these 2-tuple/4-tuple fields are first encoded using the appropriate Huffman Tables followed by their sign-bits.

BRIEF SUMMARY OF THE INVENTION

The present invention resolves efficiency problems associated with variable length decoding of n-tuple fields. Certain embodiments of the invention provide methods and systems that leverage the advantages of Huffman coding to increase processing efficiency of a data-stream while simultaneously minimizing storage requirements. Coding efficiency can be increased while storage requirements are typically reduced. Requirements for coding efficiency, decoding efficiency and table storage requirements can be balanced to produce systems that can be adapted for use in high-end network infrastructure applications and for low-resourced portable consumer devices.

The foregoing and other aspects of various embodiments of the present invention will be apparent through examination of the following detailed description thereof in conjunction with the accompanying drawings.

BRIEF DESCRIPTION OF THE DRAWINGS

The present invention is illustrated by way of example, and not limitation, in the figures of the accompanying drawings in which like references denote similar elements, and in which.

DETAILED DESCRIPTION OF THE INVENTION

Embodiments of the present invention will now be described in detail with reference to the drawings, which are provided as illustrative examples so as to enable those skilled in the art to practice the invention. Notably, the figures and examples below are not meant to limit the scope of the present invention. In the drawings, like components, services, applications, and steps are designated by like reference numerals throughout the various figures. Where certain elements of these embodiments can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Compressed data streams such as AAC and MP3 may be used in many applications including wireless data and voice transmission, audio and video recording and transmission, satellite communications and so on. Encoded data streams can include variable length codewords and sign information and each codeword can encode one or more symbols. Embodiments of the present invention may be employed to efficiently process compressed data streams encoded using any of a plurality of coding schemes. In many embodiments, data streams for decoding can include codewords that yield two, three or more symbols (i.e. 2-tuple, 3-tuple and n-tuple).

In many embodiments, data streams may be processed in which sign information follows encoded symbols in an encoded data stream. Sign information may be absolute—specifying positive or negative sign—but many encoding schemes provide sign information for non-zero values, and in some embodiments, solely for either negative or positive numbers. Since multiple symbols may be encoded in a single code word and a variable number of sign bits may be provided, the number of sign bits can be variable. Variable numbers of sign bits may be needed because only non-zero values need sign information. As a result, to properly extract an n-tuple field, a variable-length decoding process can be executed to extract the unsigned n-tuple field. After the "n" symbols are extracted, each symbol may be checked to see if it has a non-zero value. The number of non-zero values in an n-tuple field can then be used to specify an associated number of sign bits that needs to be extracted.

Figure 1:
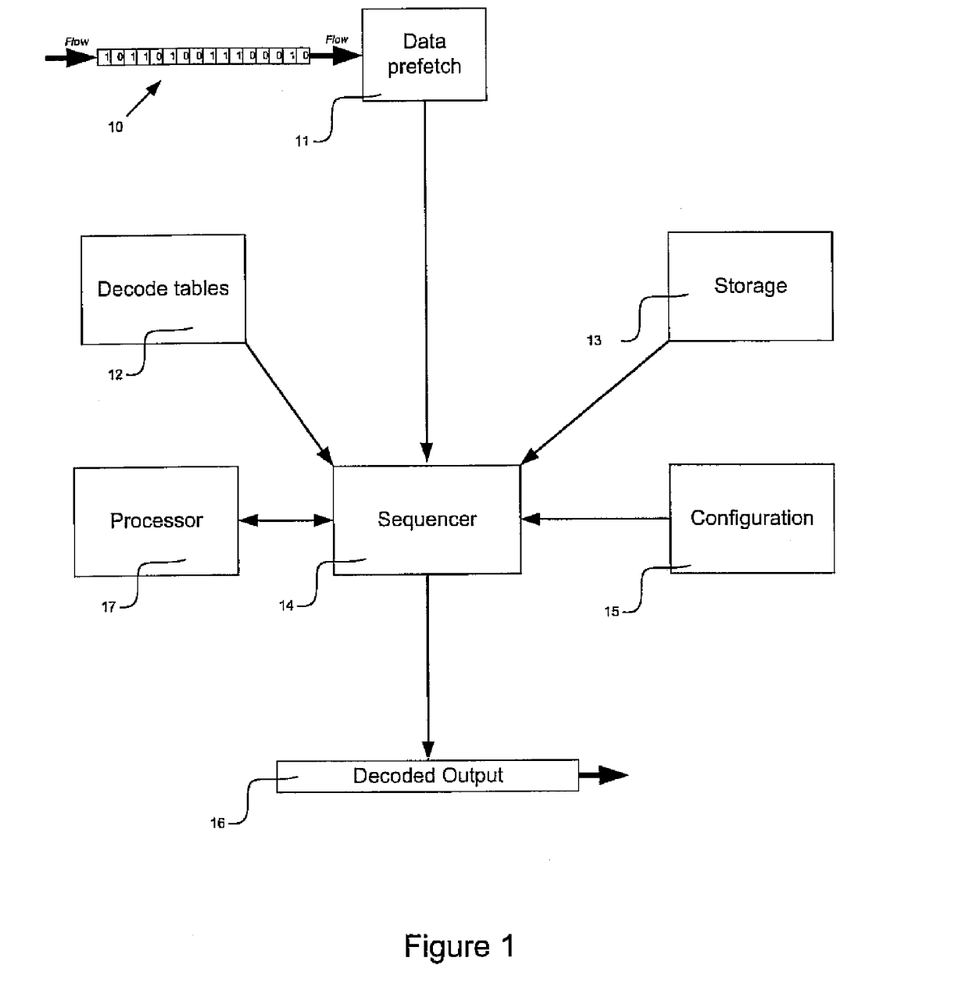
FIG. 1 illustrates an example of an accelerator for decoding data streams.

Referring to FIG. 1, in certain embodiments, decoding systems are provided as accelerators that receive portions of an encoded data stream and provide decoded data for signal processors, multimedia players and recording devices for storage in alternate formats. These accelerators can be constructed using combinations of processors and customized components according to system requirements and types of encoding schemes found in data streams. In some embodiments, plural accelerating hardware subsystems can be controlled by one or more central processors 17 for managing configuration 15, provision of decode tables 12, error handling, processing load management, etc. In certain embodiments systems employ microprocessors and digital signal processors that can execute software algorithms used in the decoding of data streams. In other embodiments, hardware components such as configurable sequencers 14 may perform decoding functions without direct intervention by processor 17. In certain embodiments, portions of the accelerators can be committed to customized hardware. Customized hardware includes storage 13 and one or more decode tables 12, prefetchers 11 for extracting data from encoded data stream 10 and for providing the data to other decoder elements and sequencers 14. Typically sequencer 14 repeatedly receives portions of encoded data stream 10 and decoding codewords contained therein using decode tables 12 to produce decoded output data 16.

In one example, an accelerator comprises a microprogrammed sequencer 14 that executes a series of decoding steps. Sequencer 14 can generate prefetch requests to receive encoded data from encoded data stream 10 and can use prefetched data to lookup elements in decode tables 12. Sequencer 14 is typically adapted to extract bit fields from the looked-up elements and to interpret information in the bit fields through combinations of bit testing, bit field comparisons, additional prefetch and additional table lookup. Sequencer 14 typically returns decoded data 16 including available sign information. Sequencer 14 may also manage a bit stream pointer that indicates a current position in the data stream from which data may be prefetched. The operation of the sequencer is described in greater detail below.

In certain embodiments sequencer 14 can be implemented entirely on one or more device. In many embodiments, sequencer 14 is programmable and can be configured to handle a plurality of data encoding schemes. In certain embodiments, configuration information 15 is provided by processor 17 based on data stream received. In some embodiments, sequencer can detect data stream format and select a configuration suitable to decode the data stream. In certain embodiments, decode tables can be provided and updated based on characteristics of encoded data stream 14. Thus, for example, if data stream 10 is identified upon receipt as an MP3 data stream, processor 17 can obtain data to configure a sequencing algorithm for sequencer 14 and can load decode tables appropriate for MP3. In some embodiments, processor 17 can be eliminated and the sequencer can include logic and devices to identify or load decode tables and sequencing algorithm appropriate for a detected data stream 10.

In certain embodiments, one or more decode tables 12 may be provided in storage such that storage usage is optimized. Optimization of storage usage can be obtained by providing a hierarchy of decode tables 12 such that symbols having higher probabilities of occurrence are decoded in higher levels of the hierarchy than lower probability symbols and higher probability symbols require fewer table lookups. In many embodiments, elements retrieved from decode tables 12 may be classified as terminating elements indicating that decoding of a codeword is completed and non-terminating elements that indicate that additional table lookups are required. For example, in certain embodiments, a terminating field in elements retrieved from decode tables 12 can indicate whether the element is terminating or non-terminating. Typically, a terminating element includes symbols and error codes while non-terminating elements typically provide information including table offsets for identifying location of secondary, tertiary and other tables. Other termination conditions may indicate completion or abandonment of decoding. For example, termination conditions may include retrieval of elements comprising inconsistent or erroneous data may be indicative of decode failure, retrieval of designated error codes that may be embedded in or near decode tables 12, programmatic interrupts and processing, sequencing or calculation errors. Sign information can be retrieved from the data stream 10 after a terminating condition is encountered.

In many embodiments, lower level tables are identified by offset information retrieved from elements in higher level tables. Additionally, size information is provided in tables that indicate a number of bits used from the data stream. In some embodiments, size information may also indicate a number of bits required to decode further information.

In certain embodiments, decode tables can be indexed using numbers of bits prefetched from the data stream. The size of the prefetch is typically sufficiently large to index a next-level table. In some instances, not all prefetch bits will be required to index the next-level table and unused bits are typically combined with more bits retrieved from the data stream to perform a next decode operation. In some embodiments, decode tables include information indicating a number of sign bits that must be retrieved from the data stream.

In many embodiments, the structure, size and organization of decode tables is configured to optimize decode operations for a selected data stream. Typically, the number, size and structure of decode tables are selected based on factors including probability distributions for symbols, available memory size and processor capabilities.

Certain embodiments of the invention provide methods and systems that leverage the advantages of Huffman coding to increase processing efficiency of a data-stream while simultaneously minimizing storage requirements. Coding efficiency can be increased while storage requirements are typically reduced. To better describe aspects of the present invention, a simple example is adopted. In the example, 8 symbols are identified by numbers 0-7 and encoded using between 2 and five bits per number. While it is clear that 8 numbers can be encoded using a maximum of 3 bits, embodiments of the invention obtain greater coding efficiency by allocating codes based on probability of occurrence of the code. This efficiency can be appreciated with reference to Table 1 which provides code assignments based on probabilities of occurrence. Typically, the probabilities of occurrence are obtained by calculation based on combinations of empirical and theoretical measurements and estimates.

TABLE 1

Simple example of Huffman code table.

| Index | Length | Code  | Probability |
|-------|--------|-------|-------------|
| 0     | 2      | 10    | 0.25        |
| 1     | 2      | 11    | 0.25        |
| 2     | 3      | 010   | 0.125       |
| 3     | 3      | 011   | 0.125       |
| 4     | 4      | 0010  | $2^{-4}$    |
| 5     | 4      | 0011  | $2^{-4}$    |
| 6     | 5      | 00010 | $2^{-4}$    |
| 7     | 5      | 00011 | $2^{-4}$    |

In the probability based coding example depicted in Table 1, a simple probability distribution is applied for the sake of discussion. The most frequently occurring numbers (Index column) are encoded using 2-bit codes and the least frequently occurring numbers are encoded using 5-bit codes as shown in the "Length" column. Assigned codes are provided in the "Code" column. It will be appreciated that, in a bit stream of the example, 50% of codes can be anticipated to have a length of two bits, 25% of codes will be 3-bits long, 12.5% will be 4 bits long and 6.25% will be 5 bits long. For the purposes of this discussion, and average codeword length (ACL) is defined as follows:

$$ACL = L_1 \times P_1 + L_2 \times P_2 + \ldots + L_n \times P_n \text{ bits/codeword}$$

where $L_n$ is the bit length of the codeword and $P_n$ is the probability of the codeword. ACL for a uniform bit-length codeword table with 8 symbols is 3 bits/codeword. Thus, for encoding n symbols using such encoding scheme would require 3n bits. Consequently, the ACL for Huffman code Table defined in Table 1 is:

$$ACL(Tab1) = (2 \times 0.25) \times 2 + (3 \times 0.125) \times 2 + (4 \times 0.0625) \times 2 + 5(1/32) \times 2$$
$$= 1 + 0.75 + 0.5 + 0.3125$$
$$= 2.5625 \text{ bits/codeword}$$

Therefore, for encoding "n" symbols, the average bit requirements would be 2.5625 n In Table 1, the "Lookups" column lists the average number of lookups required for each codeword in the example. The average number of lookups per codeword ("ALPC") can be calculated as:

$$ALPC = LK_1 \times P_1 + LK_2 \times P_2 + \ldots + LK_n \times P_n$$

where $LK_n$ is the number of lookups that are needed to decode that particular codeword. ALPC can be calculated universally for all possible symbols in a data stream or can be calculated for a subset of the possible symbols. For example, ALPC may be calculated for all decoded symbols found in an individual decode table, for all decoded symbols in a selected set of decode tables, for an identified set of symbols located in one or more tables and so on.

By referring now to FIGS. 1-2, 3a-3b and 4, the decoding of encoded data stream 10 can be understood. The Figures are based on a simple example in which data stream 10 is encoded according to Table 1, as discussed above. In the example, a single 32 byte decode table 12, such as is provided in Table 2, can be used to decode data stream 10. Size of decode table 12 is typically determined based on factors including size of the maximum codeword length generated by the encoding table. Initially, a number of bits sufficient to access decode table 12 is extracted at step 400 from bit sequences in data stream 10 to form one or more prefetches 22, 24 and 26. In the example depicted in FIG. 2, the prefetch length is configured to be 5 bits in length, to match the maximum size of codeword generated by the encoding table. However, any desired number of bits can be retrieved from bit sequence 10 and used to populate first prefetch 22. In some embodiments it can be more efficient to extract fewer bits than needed for the maximum sized codeword. In some embodiments, for efficiency, more bits than needed in the maximum sized codeword are extracted.

Figure 2:
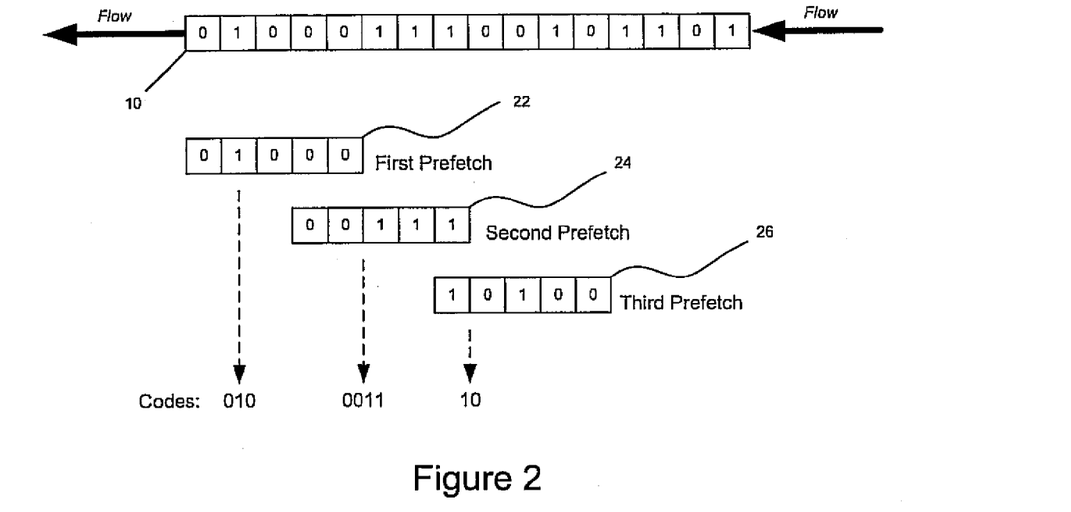
FIG. 2 illustrates an example of an encoded data stream.

It will be appreciated that in the example, bits are typically extracted sequentially from a single data stream, but it will be further appreciated that bit sequence 10 can be constructed from plural data streams according to system requirements. Upon populating first prefetch 22, the prefetch is used as an index to decode table 12 to obtain a first decoded value at step 402.

TABLE 2

Example of a 32 element lookup table.

| Prefetch | Result  | Lookups |
|----------|---------|---------|
| 00000    | error   | 1       |
| 00001    | error   | 1       |
| 00010    | {6,5,1} | 1       |
| 00011    | {7,5,1} | 1       |
| 00100    | {4,4,1} | 1       |
| 00101    | {4,4,1} | 1       |
| 00110    | {5,4,1} | 1       |
| 00111    | {5,4,1} | 1       |
| 01000    | {2,3,1} | 1       |
| 01001    | {2,3,1} | 1       |
| 01010    | {2,3,1} | 1       |
| 01011    | {2,3,1} | 1       |
| 01100    | {3,3,1} | 1       |
| 01101    | {3,3,1} | 1       |
| 01110    | {3,3,1} | 1       |
| 01111    | {3,3,1} | 1       |
| 10000    | {0,2,1} | 1       |
| 10001    | {0,2,1} | 1       |
| 10010    | {0,2,1} | 1       |
| 10011    | {0,2,1} | 1       |
| 10100    | {0,2,1} | 1       |
| 10101    | {0,2,1} | 1       |
| 10110    | {0,2,1} | 1       |
| 10111    | {0,2,1} | 1       |
| 11000    | {1,2,1} | 1       |
| 11001    | {1,2,1} | 1       |
| 11010    | {1,2,1} | 1       |
| 11011    | {1,2,1} | 1       |
| 11100    | {1,2,1} | 1       |
| 11101    | {1,2,1} | 1       |
| 11110    | {1,2,1} | 1       |
| 11111    | {1,2,1} | 1       |

In the example of Table 2, each eight bit word in the decode table includes three fields that are named for the purposes of this discussion as symbol field 31, length field 32 and terminal field 33. In the example, one bit 34 is unused. In Table 2, every symbol can be decoded if 5 bits of prefetch information 22, 24 and 26 are available and terminal field is set to "1" for every entry to indicate that a symbol is decoded in every table element. However, certain symbols can be decoded with fewer than 5 bits. Thus, for example, any prefetch commencing with a "010" returns a symbol value of "2" and length 3, indicating that only three bits were required to decode the symbol. Accordingly, Table 2 repeats the entry for symbol "2" four times to ensure that all combinations of prefetch 22, 24 or 26 will return the appropriate entry {2, 3, 1}. It will be appreciated that length field 32 in this example also indicates the number of additional bits that are required to construct a next prefetch 24 or 26.

Figure 4:
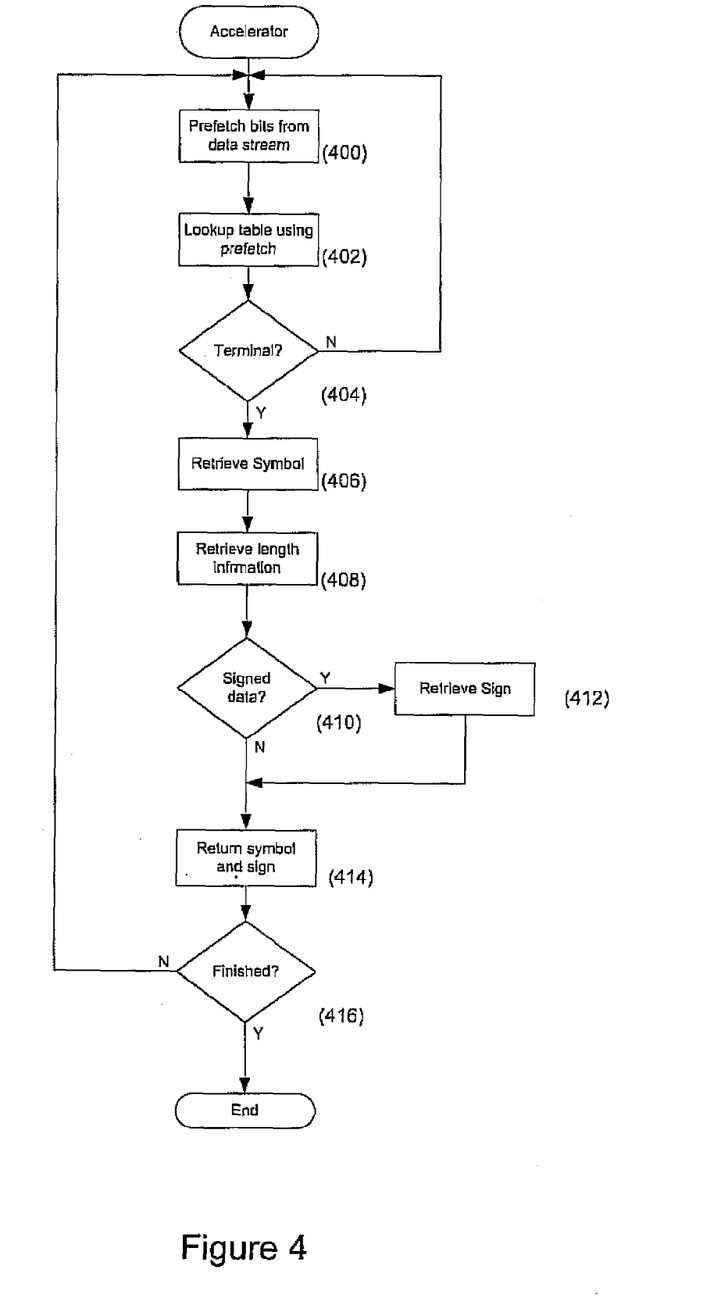
FIG. 4 is flowchart describing decoding in an one embodiment of the invention.

In the example, the first prefetch value 22 is 01000 and it will be appreciated that all index values from 01000-01011 returns an identical 8 bit result, shown in the table as {2, 3, 1}. This value indicates a symbol 31 having a value of 2, a length 32 having a value of 3 and a terminal field 33 having a value of 1. Terminal field 33 is tested at step 404 to determine if further prefetched bits are required (step 400). Terminal field 33 finds greatest application in multi-tiered decode tables in which a first value retrieved from the table indicates that a second lookup is required. This aspect of the invention will be discussed in more detail below.

At step 406, symbol field 31 provides a decoded value and at step 408 length field 32 is extracted. Length field 32 indicates that number of bits required to decode the symbol in symbol field 31 retrieved at step 406. Typically, length field 32 is used in calculating a number of bits required to build a next index. For example, if only 3 of 5 bits are needed to decode a first symbol, then three additional bits can be appended to the remaining bits in first prefetch 22 to create second prefetch 24. In some embodiments, a pointer to current decode position in data stream 10 can be advanced using length field 32. In some embodiments the pointer may be advanced upon extracting bits from data stream 10 and prior to lookup step 402. In the example, second prefetch value 24 is populated with the two unused bits from first prefetch value 22 and three additional bits from bit stream 10. A next result 30 is obtained using second prefetch 24 to index decode table 12. Second prefetch 24 of the example is identified as a 4 bit code and the decoding process continues with third prefetch 26.

In some embodiments, sign length may be encoded in a decode table. Typically, sign information follows encoded symbols in data stream 10. As will be discussed below, multiple symbols may be encoded in a single code word and a variable number of sign bits may be provided. In some encoding schemes, each symbol may be accompanied by a corresponding sign bit. In other schemes, sign information may be inserted in the data stream only for negative numbers. Thus, in the latter scheme, a two-tuple codeword, encoding 2 symbols, can have between 0 and 2 sign bits. Therefore, in certain embodiments, decode tables may provide a field that specifies the number of sign bits to be extracted from data stream 10.

In many embodiments, configuration information is tested at step 410 to determine whether sign bit count is present and, if so, sign information can be retrieved from data stream 10 at step 412. Decoded, signed information can be returned at step 414. At step 416, it is determined whether data extraction should continue by repeating steps 400-414. In some embodiments, systems can be configured to return a desired quantity of decoded data. In some embodiments, systems can be configured for free-running operations in which decoded data is automatically provided when input coded data stream 10 is active. In some embodiments, systems can be configured to decode a single codeword.

It will be noted that an unassigned bit 28 can be set to any value. It will be appreciated that unassigned bit 28 derives from the simple illustration provided. In many embodiments, table elements are implemented as 8, 16, 32 64 bit words or any other desired size of word. Further, field allocation to bits is typically determined by programming needs, by hardware configuration or some combination of programming and hardware requirements.

In Table 1, every lookup using a 5-bit prefetch returns a decoded symbol, as reflected in the terminal field 26 of every element being set to "1." Thus, every codeword can be obtained in one lookup. It can be anticipated that for any data stream, an average lookup per codeword ("ALPC") of one lookup per codeword can be anticipated. However, this ALPC value is achieved at the cost of lookup table redundancy; in this example, 7 symbols can be decoded using 32 bytes of storage.

Figure 5A:
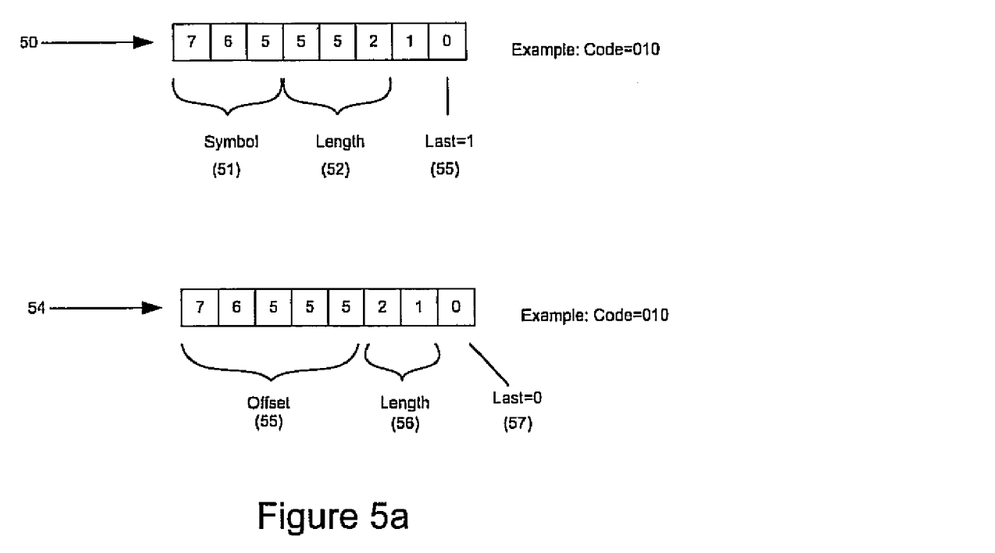
FIG. 5a illustrates the structure of certain examples of decode table elements in a multi-tier decoding tables.

In certain embodiments, storage requirements can be minimized using hierarchical tables having primary tables, secondary tables, tertiary tables and son on. An examination of Table 2 reveals that the use of variable length coding systems can require large decoding table sizes with redundant elements. In Table 2, for example, 32 elements are required to decode 8 symbols. Certain embodiments improve storage efficiency using two or more tables are arranged hierarchically to maximize coding efficiency while minimizing table size such that the number of discrete elements is maintained close to the total table size. Certain embodiments maintain the two or more tables in sequential storage areas and support an offset capability in decoding tables. A simple example of hierarchical decode tables is provided as Table 3 and elements of the hierarchical tables are depicted in FIG. 5a.

Table 3 may be used to decode symbols encoded using Table 1. In this example, two types of result may be returned from the three decoding tables. First result type 50 has a termination bit 53 set while second result type 54 has a termination bit 57 cleared. First result type 50 typically contains a valid result including a decoded symbol 51 and used bit length 52. Second result type 54 typically received when insufficient bits are available to decode the symbol. Second result type 54 can be associated with low probability symbols that, in the example, require more than three bits for encoding. Second result type includes an offset 55 that typically identifies the start of a next table relative to a currently indexed table element. Second result type 56 can also include a length field 57 that identifies the number of bits needed to index a secondary table.

TABLE 3

Example of two-tier hierarchical decode tables.

| Prefetch | Result | Table Index | Lookups |
|---|---|---|---|
| 000 | {8,2,0} | 0 | 1+ |
| 001 | {12,1,0} | 1 | 1+ |
| 010 | {2,3,1} | 2 | 1 |
| 011 | {3,3,1} | 3 | 1 |
| 100 | {0,2,1} | 4 | 1 |
| 101 | {0,2,1} | 5 | 1 |
| 110 | {1,2,1} | 6 | 1 |
| 111 | {1,2,1} | 7 | 1 |
| 00 | {error} | 8 | — |
| 01 | {error} | 9 | — |
| 10 | {6,2,1} | 10 | 2 |

TABLE 3-continued

Example of two-tier hierarchical decode tables.

| Prefetch | Result | Table Index | Lookups |
|---|---|---|---|
| 11 | {7,2,1} | 11 | 2 |
| 0 | {4,1,1} | 12 | 2 |
| 1 | {5,1,1} | 13 | 2 |

In the example, a prefetch value starting with the bit sequence "00" returns second result type 54. For example, a bit sequence of 00011 generates an initial prefetch value of "000" which returns a result of {8,2,0}. The termination bit of the result indicates a secondary look up and the result further provides an offset of 8 and a requirement for 2 additional bits. It will be appreciated that various types of offset can be used. In some embodiments, lookup tables can be arranged contiguously in a memory space or in sufficient proximity in memory space to be indexed by a common index. In these embodiments, the offset can be a value that identifies the location of a secondary table relative to the start of the primary table, as shown in the example of Table 3. In other embodiments, the offset may be a value that identifies the location of a secondary table relative to the position of the currently indexed table element. In still other tables, the index can be indirect and used to retrieve an index or absolute value where the secondary table may be found.

Continuing with the example, the next two bits are used to index the secondary table that is stored 8 elements from the start of the primary table. The next two bits, being "11," return a secondary result of {7,2,1} which includes a termination bit indicating no tertiary lookup is needed and that the coded symbol is 7; as before the length of 2 specifies the number of bits used in the secondary lookup. It will be appreciated that this result is consistent with the coding scheme of Table 1, above. In the example, Table 3 uses a primary and two secondary decoding tables that require 14 bytes of storage. Thus the scheme of Table 3 provides improved storage efficiency over the scheme of Table 2 to perform the same decoding. Thus, embodiments of the invention can maximize coding efficiency while minimizing storage requirements.

As described above, the number of lookups can affect performance of decoding systems. In the example of Table 3, the ALPC value may be calculated as follows:

$$ALPC = (1 \times 0.25) \times 2 + (1 \times 0.125) \times 2 + (2 \times 0.0625) \times 4$$
$$= 0.5 + 0.25 + 0.5$$
$$= 1.25$$

TABLE 4

Example of three-tier hierarchical decode tables.

| Prefetch | Result | Table Index | Lookups |
|---|---|---|---|
| 00 | {4,2,0} | 0 | 1+ |
| 01 | {10,1,0} | 1 | 1+ |
| 10 | {0,2,1} | 2 | 1 |
| 11 | {1,2,1} | 3 | 1 |
| 00 | {error} | 4 | — |
| 01 | {4,1,0} | 5 | 2+ |
| 10 | {4,2,1} | 6 | 2 |

TABLE 4-continued

Example of three-tier hierarchical decode tables.

| Prefetch | Result | Table Index | Lookups |
|---|---|---|---|
| 11 | {5,2,1} | 7 | 2 |
| 0 | {6,1,1} | 8 | 3 |
| 1 | {7,1,1} | 9 | 3 |
| 0 | {2,1,1} | 10 | 2 |
| 1 | {3,1,1} | 11 | 2 |

Table 4 shows an example of a table that can be used to decode the codewords of Table 1. In the example of Table 4, the ALPC value may be calculated as follows:

$$ALPC = 1 \times 0.25 + 1 \times 0.25 + 2 \times 0.125 + 2 \times 0.125 + 2 \times 0.0625 +$$
$$2 \times 0.0625 + 3 \times 0.03125 + 3 \times 0.03125$$
$$= 1.4375$$

Figure 5B:
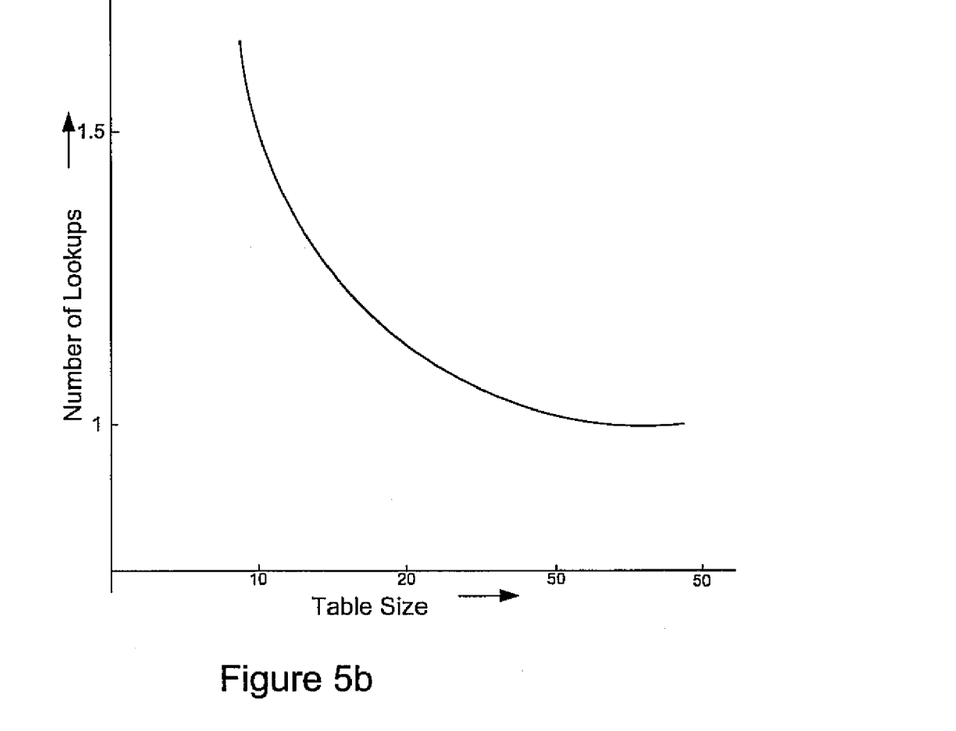
FIG. 5b illustrates relative efficiencies of multiple lookups per decoded symbol and table size.

Referring to FIG. 5b, it can be appreciated that the decoding scheme employed in Tables 2-4 and FIG. 5a can incur significant processing overhead because a percentage of decodes can require multiple bit prefetches and multiple table lookups for a single decode. The graph of FIG. 5b illustrates the relationship between table size and the number of lookups required for a given encoded data stream. The number of lookups may be related to processing overhead and can be used to calculate limits of the coding scheme. Therefore, embodiments of the invention are configured to optimize encoding/decoding schemes based on table size, storage capacity, processor capabilities and other factors. The other factors can include benefits derived from reduced prefetch sizes such as reduction in hardware components and bus size and bandwidth requirements.

Figure 6:
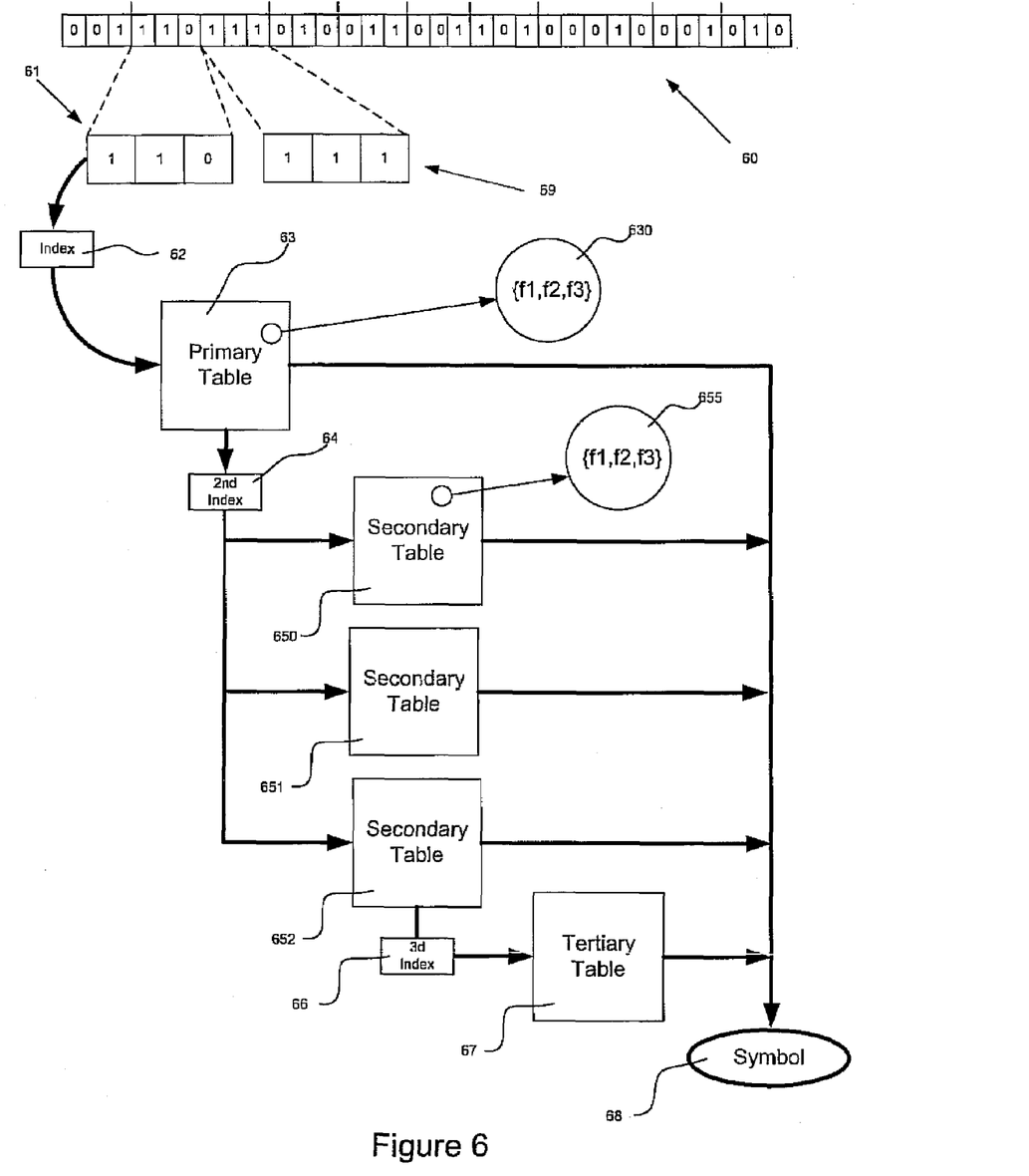
FIG. 6 is an illustration of a simplified decode process using multi-tiered decode tables.

FIG. 6 includes an illustration that summarizes the operation of one example embodiment that implements a hierarchy of tables to optimize encoding efficiency while maintaining relatively small decode tables. In the example, a plurality of Huffman-like tables are arranged in a hierarchical structure with a primary table 63, one or more secondary tables 650-652 and one or more tertiary tables 66. In the example, a first portion 61 is prefetched from a data stream 60. The first portion may then be used to obtain a first index 62 for indexing primary table 63. One or more unused data bits may be available from an immediately preceding portion of data stream 60 and any such bits are typically combined with first portion 61.

Figure 3A:
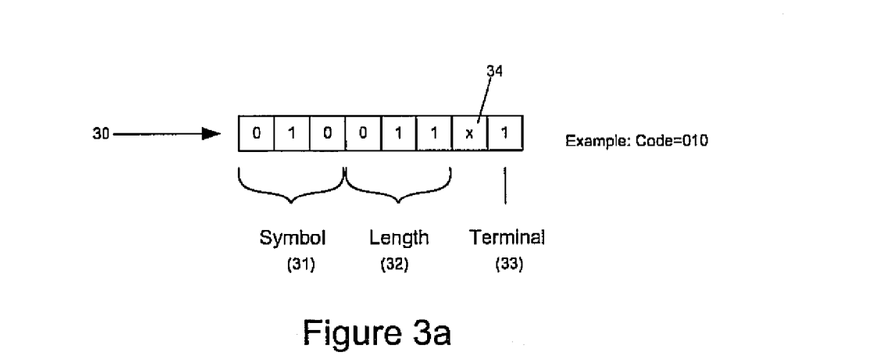
FIGS. 3a and 3b illustrate examples of decode table elements.
Figure 3B:
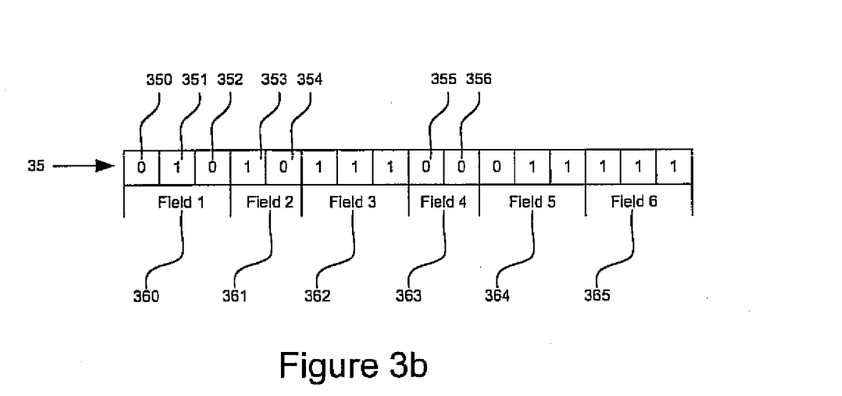

Referring now also to FIG. 3a, in many embodiments, first index 62 is initially used to select an element 630 of a primary table 63. Element 630 may be a byte, word, long word or any suitably sized data element. Element 630 typically includes a plurality of fields. FIG. 3a provides an illustration of an 8 bit element 30 in one example. In the example termination field 33 typically indicates the function of one or more of the other elements 31 and 32 of element 30. For example, last field could be set to "1" to indicate that a symbol has been decoded and can be found in symbol field 31 and that length field 32 indicates how many bits of the index were required to decode the symbol. In the latter example, length field 32 can indicate actual number of used bits but can also indicate how many bits should be fetched from data stream 60 to populate next first index 62. In another example, last field may be set to "0" to indicate that lookup of a secondary table 650-652 is required to advance decoding. An offset to secondary table 650-652 is typically provided in symbol field 31 and length field 32 can indicate a number of additional bits required to populate second index 64. Alternatively, length field 32 may indicate size of second index 64. In certain embodiments, offset may require more or less bits than provided by symbol field 31 and allocation of bits to fields may be modified accordingly.

In many embodiments, second index 64 is constructed from unused bits remaining in first index 62 and additional bits 69 fetched from data stream 60 as indicated by length field 32 from element 630. Second index 64 may then be used to index into one of secondary tables 650-652 as indicated by offset in symbol field 31 of element 630. The offset information typically includes information identifying location of one of secondary tables 650-652. Location may be identified as a table start address relative to the start or end of primary table 63 or relative to element 630. Location may also be identified using any other means known in the art and can for example also be identified using an index or an absolute address that can be referenced by an offset. Secondary index 64 is used to obtain element 651 from the identified secondary table 650-652.

As was described for element 630 from primary table 63, element 655 may provide a result or offset information to tertiary table 67. In certain embodiments, elements 630 and 655 may also indicate an error code when, for example, malformed indices are detected (e.g. out of range condition) or when invalid and inconsistent results are obtained from decode tables.

In certain embodiments, the structure of primary table 63, secondary tables 650-652 and tertiary table 67 are identical. In other embodiments, differently structured elements can be found in primary table 63, secondary tables 650-652 and tertiary table 67. For example, in some embodiments the size elements in primary tables 63 can be different from the size of secondary tables and so on. Likewise, size of indices 62, 64 and 66 may have different lengths in accordance with the respective sizes of primary table 63, secondary tables 650-652 and tertiary table 67.

In certain embodiments, decoding can be accomplished with primary tables 63 and secondary tables 650-652. However, it is anticipated that in at least some embodiments, multiple levels of tables may be required for complete decoding. As discussed above, many table structures are contemplated. Applications ranging from mobile electronic devices to network infrastructure can have different performance requirements and substantially different system resources for delivering such performance. Accordingly, different systems can optimize table configuration based on system characteristics.

Figure 7A:
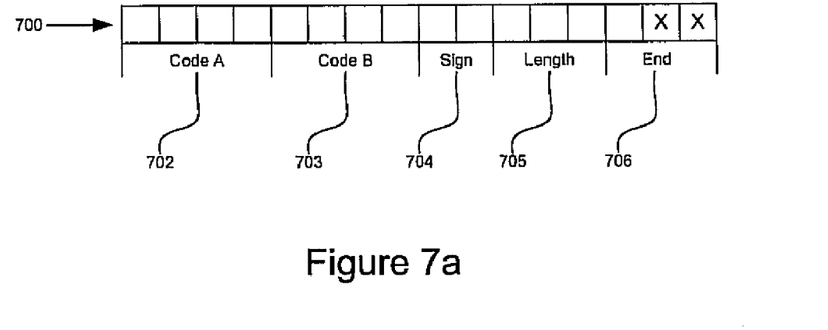
FIG. 7a-7c illustrates an example of 16 bit decode table elements including n-tuple elements.
Figure 7B:
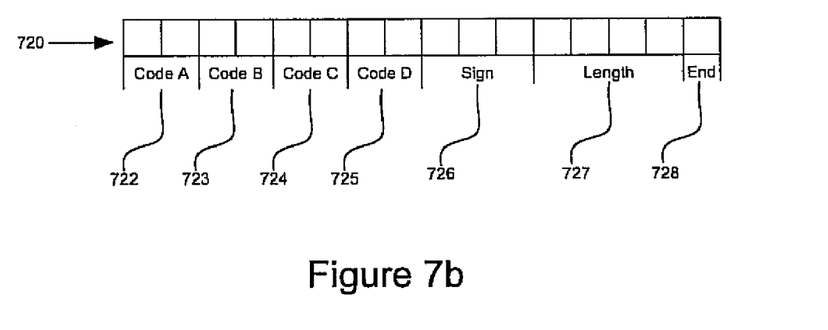
Figure 7C:
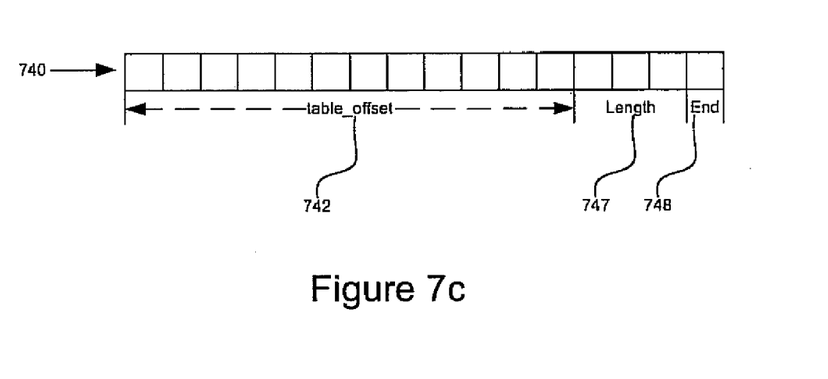

Referring to FIGS. 7a-c, the structure of elements within tables in different embodiments may vary. In certain embodiments, decode tables can be configured to decode codewords that hold multiple data components. FIG. 7a provides an example in which a 2-tuple comprising two four-bit codes 702, 703 can be decoded in element 700. FIG. 5b depicts an example in which 4-tuple comprising two-bit codes 722, 723, 724 and 725 can be retrieved in element 720. FIG. 7c illustrates a generalized element 740 which returns offset information referencing lower order tables. Table 5 provides an example of a partial set of tables for decoding 2-tuple.

TABLE 5

Example of two-tier hierarchical decode tables for decoding 2-tuples.

| Prefetch | Result | Table Index | Lookups |
|---|---|---|---|
| 000 | {8,2,0} | 0 | 1+ |
| 001 | {12,1,0} | 1 | 1+ |
| 010 | {0,6,3,1} | 2 | 1 |
| 011 | {7,7,3,1} | 3 | 1 |
| 100 | {0,0,2,1} | 4 | 1 |
| 101 | {0,0,2,1} | 5 | 1 |
| 110 | {0,7,2,1} | 6 | 1 |
| 111 | {0,7,2,1} | 7 | 1 |
| 00 | {error} | 8 | — |
| 01 | {error} | 9 | — |
| 10 | {6,0,2,1} | 10 | 2 |
| 11 | {7,0,2,1} | 11 | 2 |
| 0 | {3,3,1,1} | 12 | 2 |
| 1 | {2,3,1,1} | 13 | 2 |

In certain embodiments, information related to sign of decoded symbols can be provided in elements 700 and 720. It will be appreciated that sign information typically follows a symbol in data streams. In some embodiments, sign information is suppressed for the number zero and, in many embodiments, sign information is suppressed for outputs which represent positive numbers. For multi-tuple elements 700 and 720, the number of sign bits available in data streams can vary significantly. For example, symbols in element 720 may require between 0 and 4 bits of sign information for decoding of symbols. In one specific example, in a data stream that suppresses sign information for the number zero, sign information can indicate a number of sign bits to be extracted from the data stream; a decoder may then allocate the sign information sequentially to non-zero symbols.

Referring specifically to FIG. 7c, non-terminating elements 740 can support various addressing schemes. As described above, in some embodiments, table offset 742 of element 740 can identify a lower level table as an offset in storage and, in such embodiments, tables are typically located in close proximity. In other embodiments, offset addresses can be used in indirect addressing schemes. In these embodiments table offset 742 references one or more of a set of registers, memory locations or other storage elements that contain information identifying lower level tables. In certain embodiments, indirect addressing methods, registers and schemes supported by processors may be accessed using table offset 742. In certain embodiments, other methods of referencing lower level tables can be implemented including, for example, the use of interrupt and trap mechanisms where handlers are selected based on the content of table offset 742.

Figure 8:
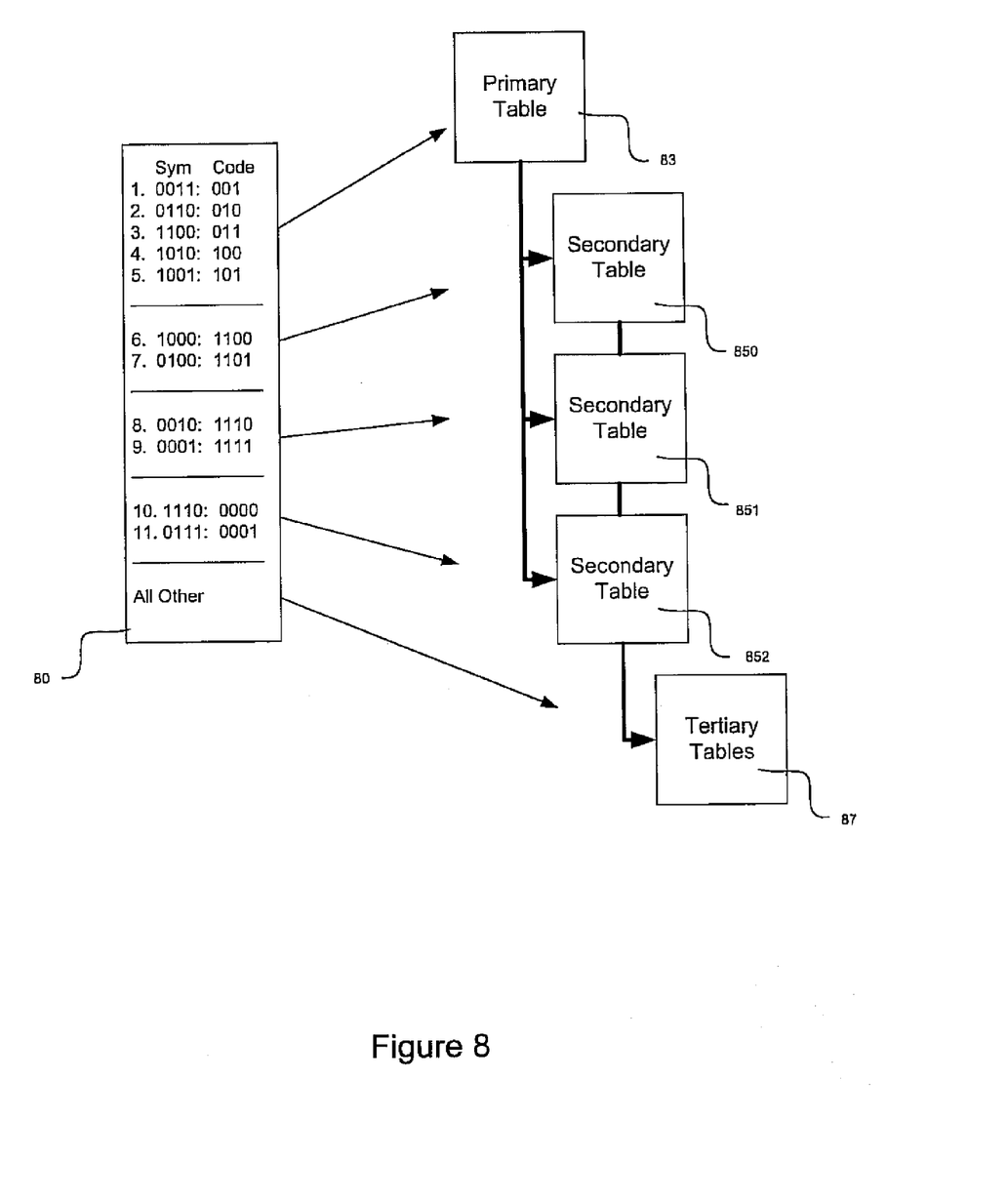
FIG. 8 depicts the indexing of multi-tiered tables in one example of an embodiment.

Referring to FIG. 8, multi-level table structures reflect the probabilistic assignment of codes to symbols discussed previously. Thus, codes identifying high probability symbols can typically be decoded using higher level tables. In the simplified example of FIG. 8, a set of symbols is ordered by probability of occurrence. Higher probability symbols (1-5) are assigned 3-bit codes and can typically be decoded using primary table 83. Next, secondary tables 850-852 can be used to decode 4-bit encoded symbols. In the example, all other codes are decoded using tertiary tables 87. In many embodiments, symbols are organized according to calculated frequencies of occurrence of symbols. Frequency of occurrence can be calculated using any desired method including methods that use some combination of empirical, arbitrary and calculated schemes. As discussed previously, tables can be constructed in sizes and formats according to available resources and processing constraints. In one example, element configurations can be as depicted in FIGS. 5a-c, each element being a 16 bit word. In other examples, elements can be formed in any preferred word size including 8, 16, 32 and 64 bits and assignment of bit fields within the elements may be altered to support a variety of table sizes, symbol bit sizing and bit handling of a host processor (including endianness).

In the simplified example of FIG. 8, the primary table 83 includes decoded values for five symbols 400 and three secondary tables 850-852 each including decoded values for two symbols 802, 804 and 806. All other symbols 408 are decoded by reference to tertiary tables 87. It will be appreciated that plural tertiary tables 87 can be referenced by each secondary table 850-852 and that the size and quantity of tertiary tables 87 can be configured as desired. In this example, processing is optimized for the most commonly occurring symbols which can be assigned three-bit codes. The next of symbols, ranked 6-11 can be coded using four-bit codes. The remaining symbols can be coded in, for example, six bit codes.

Figure 9:
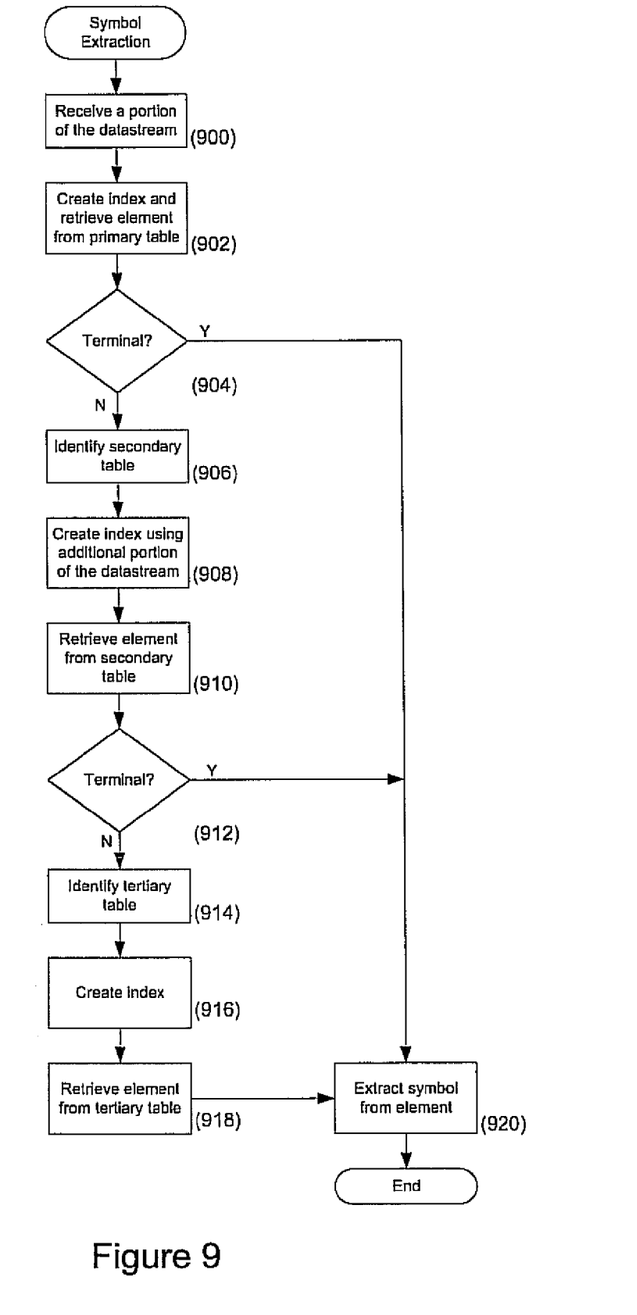
FIG. 9 is a flowchart describing decoding operations in an example of an embodiment of the invention.

Referring to FIG. 9 together with FIGS. 1, 2, 3a-3b and 6, a flowchart illustrates one method that can be used to decode a data stream encoded according to the simplified example discussed above. First, a first prefetch portion 22 of data stream 10 is received at step 900. Next, at step 902, an index 62 to primary table 63 can be created and first result element may be extracted from primary table 63. The prefetch size is typically equal in size to the index, but larger prefetch portions can be extracted.

Having obtained a first result element the terminal bits 33 can be examined at step 904 to ascertain whether a decoded symbol 31 has been retrieved. If terminal bits 33 requires decoding to continue, a selected one of secondary tables 650-652 is referenced using offset 742 (see e.g. FIG. 7c) at step 906. Next, at step 908, additional bits are retrieved as required for second prefetch 24 to form secondary index 64 used to reference the selected secondary table 650-652. At step 910, a secondary result element is retrieved from the selected secondary table 650-652.

Having obtained a second result element the terminal bits 33 can be examined at step 912 to ascertain whether a decoded symbol 31 has been retrieved. If terminal bit 33 requires decoding to continue, a selected one of tertiary tables 67 is referenced using offset 742 (see e.g. FIG. 7c) at step 914. Next, at step 916, additional bits are retrieved as required for third prefetch 26 to form tertiary index 66 used to reference tertiary table 67. At step 918, a secondary result element is retrieved from tertiary table 67.

In certain embodiments, more than three levels of table can be provided so that the process can be extended to include quaternary tables, quinary tables, and so on. However, in the example one or more tertiary tables 67 are the last level of tables and upon retrieving an element, symbol 31 can be extracted from result element at step 720 and decoding can move to a next symbol.

Figure 10:
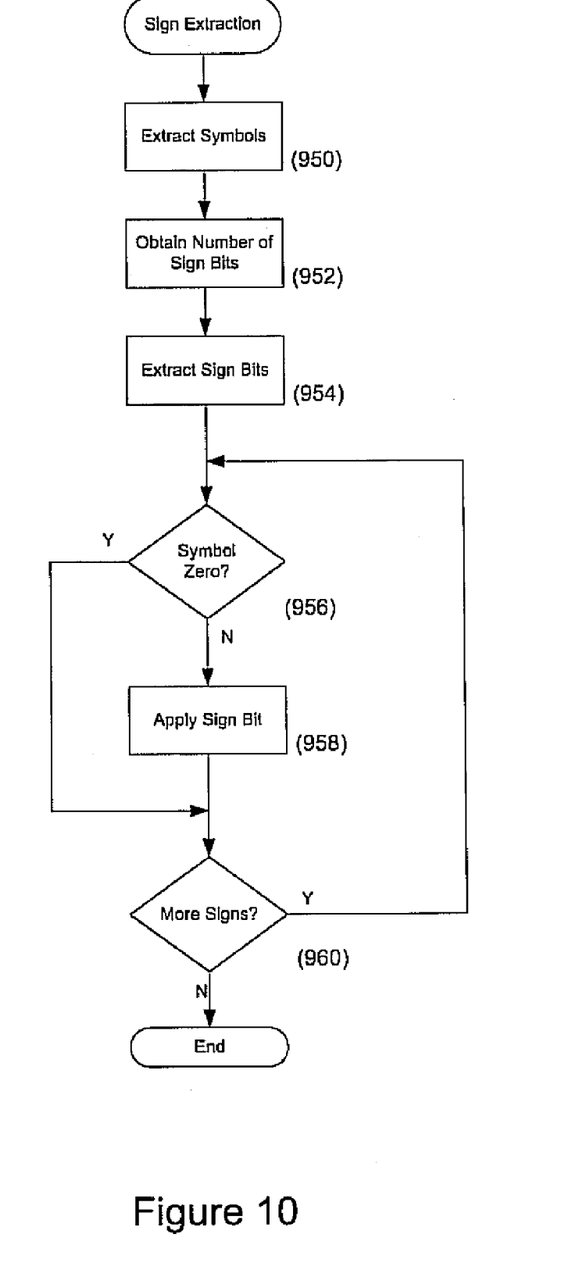
FIG. 10 is a flowchart describing sign extraction in an example of an embodiment of the invention.

FIG. 10 illustrates a process for extracting sign information from a data stream. After extraction of symbols from the data stream at step 950, the number of sign bits in the data stream is retrieved at step 952. The number of sign bits is typically extracted from elements in lookup tables. At step 954, the indicated number of sign bits may be retrieved from the data stream. In some embodiments, some bits may remain unused in an index and these bits can be combined as necessary with additional bits from the data stream. At step 956, a first decoded symbol is tested for zero value. In the example, sign information is suppressed for zero values and multiple symbols are decoded from decode tables. Thus, if at step 956, the current symbol is determined to be non zero, sign is applied at step 958. For example, a "1" may indicate a negative number and a "0" may indicate a positive number. If zero was detected, step 958 is bypassed. At step 960, if any more sign bits remain, the process repeats from step 956; otherwise processing is completed and next symbols may be decoded.

It is apparent that the above embodiments may be altered in many ways without departing from the scope of the invention. Further, the invention may be expressed in various aspects of a particular embodiment without regard to other aspects of the same embodiment. Still further, various aspects of different embodiments can be combined together. Accordingly, the scope of the invention should be determined by the following claims and their legal equivalents.

What is claimed is:

1. A method for decoding a data stream comprising:
   forming an index including one or more bits received from the data stream;
   retrieving an element in a selected table based on the index, said element comprising one of a termination condition and a non-termination condition;
   selecting a next selected table based on information included in the element, if said element comprises said non-termination condition;
   repeating said forming and said retrieving, if said element comprises said non-termination condition; and
   extracting one or more symbols from information in the element.

2. A method according to claim 1, wherein the termination condition comprises a bit setting in the element.

3. A method according to claim 1, wherein the termination condition comprises an error code included in the element.

4. A method according to claim 1, wherein bit-length of the index is determined by a size field in the information.

5. A method according to claim 4, wherein the size field indicates a number of additional bits to be obtained for forming a next index, wherein the next index is for identifying an element in the next selected table.

6. A method according to claim 1, wherein the selected table initially comprises a predetermined primary table.

7. A method according to claim 1, wherein the next selected table is identified using an offset from the selected table.

8. A method according to claim 1, and further comprising:
   obtaining sign bits associated with the one or more symbols, wherein the number of sign bits is provided in the element.

9. A method according to claim 1, wherein the one or more symbols includes two symbols.

10. A method according to claim 1, wherein the one or more symbols includes four symbols.

11. A system for decoding a data stream comprising:
    one or more tables, each table including a plurality of elements, said plurality of elements comprising a combination of terminating elements and non-termination elements;
    a prefetcher for receiving encoded bits from the data stream;
    a sequencer for obtaining a codeword from the encoded bits and for using sequential portions of the codeword to locate an element in the one or more tables that decodes the codeword.

12. The system of claim 11, wherein each sequential portion indexes a selected table from the one or more tables to obtain a desired element.

13. The system of claim 11, wherein certain of the terminating elements comprise one or more decoded symbols.

14. The system of claim 11, wherein certain of the terminating elements comprise error codes.

15. The system of claim 11, wherein each non-terminating element in each of the one or more tables identifies a different table.

16. The system of claim 15, wherein each non-terminating element identifies a number of bits of the codeword to be used for indexing the different table.

17. The system of claim 11, wherein the size of each table in the one or more tables is configured to optimize an average number of lookups per codeword ("ALPC") associated with the data stream.

18. The system of claim 11, wherein the size of each table in the one or more tables is configured to optimize an average number of lookups per codeword ("ALPC") associated with at least one selected table of the one or more tables.

19. A method for decoding a data stream comprising:
forming an index including one or more bits received from the data stream;
retrieving an element in a selected table based on the index, said element comprising one of a termination condition and a non-termination condition;
selecting a next selected table based on information included in the element, if said element comprises said non-termination condition;
repeating said forming and said retrieving, if said element comprises said non-termination condition;
extracting one or more symbols from information in the element; and
obtaining sign bits associated with the one or more symbols, wherein the number of sign bits is provided in the element; wherein
tables are selected from a hierarchical set of tables, and wherein
each table in the set has an associated table size that is configured to optimize an average number of lookups per codeword ("ALPC") associated with at least one table.

* * * * *